(12) United States Patent
Oyama et al.

(10) Patent No.: US 10,602,650 B2
(45) Date of Patent: Mar. 24, 2020

(54) COMPONENT MOUNTING APPARATUS AND COMPONENT MOUNTING SYSTEM

(71) Applicant: FUJI CORPORATION, Chiryu-shi (JP)

(72) Inventors: Shigeto Oyama, Kariya (JP); Satoshi Yoshioka, Nagoya (JP); Hirotaka Hirayama, Toyohashi (JP); Satoshi Ushii, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 106 days.

(21) Appl. No.: 15/536,183

(22) PCT Filed: Dec. 16, 2014

(86) PCT No.: PCT/JP2014/083285
§ 371 (c)(1),
(2) Date: Jun. 15, 2017

(87) PCT Pub. No.: WO2016/098184
PCT Pub. Date: Jun. 23, 2016

(65) Prior Publication Data
US 2017/0354073 A1 Dec. 7, 2017

(51) Int. Cl.
*B23P 19/00* (2006.01)
*H05K 13/08* (2006.01)

(52) U.S. Cl.
CPC ......... *H05K 13/08* (2013.01); *H05K 13/0815* (2018.08); *Y10T 29/53174* (2015.01)

(58) Field of Classification Search
CPC ............... H05K 13/08; H05K 13/0815; H05K 13/0408; H05K 13/041; H05K 13/0413; H05K 13/046; Y10T 29/49826; Y10T 29/53357; Y10T 29/49133; Y10T 29/53174; A61M 2205/14; A61M 2205/215
(Continued)

(56) References Cited

FOREIGN PATENT DOCUMENTS

| JP | 4-196200 A |   | 7/1992 |
| JP | 04196200 A | * | 7/1992 |

(Continued)

OTHER PUBLICATIONS

Extended European Search Report dated Nov. 17, 2017 in Patent Application No. 14908394.1.
(Continued)

*Primary Examiner* — Thiem D Phan
(74) *Attorney, Agent, or Firm* — Oblon, McClelland, Maier & Neustadt, L.L.P.

(57) ABSTRACT

In a case where check unnecessary components (chip components a to c) that do not require checking of the mounted states of the other components before being mounted and check necessary components (die components X and Y) that require checking of the mounted states of the other components before being mounted are mounted on a board, the check unnecessary components are mounted first and the mounted state of each component is inspected. When mounting of the check unnecessary components is completed, the check necessary components are mounted after it is checked that the mounted states of the check unnecessary components are normal based on the inspection results.

6 Claims, 11 Drawing Sheets

(58) Field of Classification Search
USPC .................. 29/739, 740, 744, 760, 832, 834
See application file for complete search history.

(56) References Cited

FOREIGN PATENT DOCUMENTS

| | | | |
|---|---|---|---|
| JP | 2007-129132 A | | 5/2007 |
| JP | 2007-158213 A | | 6/2007 |
| JP | 2010-123906 A | | 6/2010 |
| JP | 2010-129738 A | | 6/2010 |
| JP | 2010123906 A | * | 6/2010 |
| JP | 2010129738 A | * | 6/2010 |
| JP | 2011-9605 A | | 1/2011 |

OTHER PUBLICATIONS

International Search Report dated Mar. 24, 2015, in PCT/JP2014/083285, filed Dec. 16, 2014.
Office Action dated Sep. 28, 2018 in Japanese Patent Application No. 2016-564494 (submitting English translation only, 3 pages.

* cited by examiner

FIG.4

```
DO YOU WANT TO CHECK BEFORE MOUNTING?
    CHIP a       YES      [ NO ]
    CHIP b       YES      [ NO ]
    CHIP c       YES      [ NO ]
    DIE X      [ YES ]      NO      ⌇‒ 88a
    DIE Y      [ YES ]      NO
           [ DETERMINE ]
```

FIG.5

```
       PLEASE ENTER IMPORTANCE.
    DIE X      [ HIGH ]     LOW
    DIE Y        HIGH     [ LOW ]   ⌇‒ 88a

[ DETERMINE ]
```

FIG.12A

```
DO YOU WANT TO INSPECT AFTER MOUNTING?
    CHIP a      [YES]    NO
    CHIP b      YES     [NO]       ----88a
    CHIP c      [YES]    NO

[  DETERMINE  ]
```

FIG.12B

```
DO YOU WANT TO INSPECT AFTER MOUNTING?

MOUNTING ORDER
    FIRST       [YES]    NO
    SECOND      [YES]    NO
    THIRD        YES    [NO]
    FOURTH       YES    [NO]       ----88a

[  DETERMINE  ]
```

COMPONENT MOUNTING APPARATUS AND COMPONENT MOUNTING SYSTEM

TECHNICAL FIELD

The present application relates to a component mounting apparatus and a component mounting system.

BACKGROUND ART

In the related art of a component mounting apparatus that mounts components on a board, an apparatus that inspects the mounted states of the components mounted on the board is known. For example, in a component mounting apparatus of PTL 1, when a board on which some components are mounted in a preceding step is carried in, the board is inspected, and in a case where the mounted states of the components are not normal, it is determined whether or not the mounted states can be corrected in a later step. Then, if it is determined that the mounted states cannot be corrected in a later step, the component is not mounted on the board, and if it is determined that the mounted states can be corrected in a later step, the component is mounted on the board. As a result, in a case where the mounted states of the components have an uncorrectable defect, a component is prevented from being mounted further, therefore it is possible to prevent the component from being wastefully consumed.

CITATION LIST

Patent Literature

PTL 1: JP-A-2011-9605

SUMMARY

In such a component mounting apparatus, since some components are expensive depending on the type of components, it is an important problem to prevent waste of components. In the above-described component mounting apparatus, it is described that presence or absence of a defect is determined for each step, and if an uncorrectable defect occurs, a component is not mounted in a later step, but in a case where multiple components are mounted in one step, there is no consideration given to defects which occur in the middle of the step. Therefore, if a defect occurs in the middle of the step, there is a concern that all the components mounted after that step will be wasted.

The main object of the present disclosure is to properly prevent waste of components.

The present disclosure has adopted the following means to achieve the above-mentioned main object.

The component mounting apparatus of the present disclosure includes mounting device for mounting a component on a board and inspection device for inspecting a mounted state of the component mounted on the board, in which the components include a check unnecessary component that does not require checking of a mounted state of another component before being mounted and a check necessary component that requires checking of a mounted state of the other component before being mounted, and the mounting device mounts the check necessary component on the board after checking that the mounted state of the check unnecessary component is normal based on an inspection result of the inspection device after the check unnecessary component is mounted on the board.

The component mounting apparatus of the present disclosure mounts a check necessary component on a board after checking the mounted state of a check unnecessary component is normal based on an inspection result of the inspection device after the check unnecessary component is mounted on the board. In this way, in a case where the mounted state of a check unnecessary component is not normal, a check necessary component is not mounted on a board, and therefore it is possible to prevent the check necessary component from being wastefully consumed. As a result, it is possible to properly prevent a component from being wasted in a case where a defect occurs in the mounted states of components in the middle of a mounting step.

Further, the component mounting apparatus of the present disclosure includes imaging device capable of imaging a component mounted on the board, in which the inspection device may inspect the mounted state of the component based on an image captured by the imaging device, and the mounting device may mount the next check unnecessary component on the board when the check unnecessary component which is an inspection target is imaged. In this way, it is possible to mount the next check unnecessary component on the board without waiting for completion of inspection of the check unnecessary component that has been mounted, thereby suppressing a reduction in mounting efficiency.

In the component mounting apparatus according to an aspect of the present disclosure, in a case where multiple check unnecessary components are included in the same visual field range, the imaging device may image the multiple check unnecessary components after the multiple check unnecessary components are mounted on the board. In this way, it is possible to shorten the time required for imaging of check unnecessary components, thereby further suppressing a reduction in mounting efficiency.

Further, in the component mounting apparatus of the present disclosure, the inspection device may skip inspection of some of the check unnecessary components among the check unnecessary components mounted on the board, and the mounting device may mount the check necessary components on the board if it is checked that the mounted states of the remaining check unnecessary components except for the some check unnecessary components are normal. In this way, it is possible to mount check necessary components without inspecting all the check unnecessary components, thereby shortening the inspection time compared with the case where all the check unnecessary components are inspected.

Further, in the component mounting apparatus of the present disclosure, in a case where multiple check necessary components are mounted, the mounting device may mount the subsequent check necessary component on the board after checking the mounted states of the previously mounted check necessary components are normal based on the inspection result. In this way, in a case where multiple check necessary components are mounted, it is possible to properly prevent a check necessary component to be mounted later from being wasted.

The component mounting system of the present disclosure is a component mounting system including any one of the above-described component mounting apparatuses and a management device that manages mounting order of the components in the component mounting apparatus, in which the management device includes setting accepting device for accepting setting as to whether the component is the check unnecessary component or the check necessary component, storage device for storing the accepted setting in association with each component, mounting order setting device for setting the check unnecessary component first in the mounting order before mounting the check necessary component, and output device for outputting the set mounting order to the component mounting apparatus.

In the component mounting system of the present disclosure, the management device accepts the setting as to whether a component is a check unnecessary component or a check necessary component, sets the check necessary component to be mounted after the check unnecessary component is mounted in the mounting order of the components, and outputs the mounting order to the component mounting apparatus. Further, the component mounting apparatus mounts a check unnecessary component on the board based on the mounting order, and then mounts a check necessary component on the board after checking that the mounted state of the check unnecessary component is normal based on the inspection result. In this way, in a case where the mounted state of a check unnecessary component is not normal, a check necessary component is not mounted on a board, and therefore it is possible to prevent the check necessary component from being wastefully consumed. Since it is possible to set whether a component is a check unnecessary component or a check necessary component, thereby reducing the number of components that could possibly be wasted. Therefore, it is possible to properly prevent a check necessary component from being wasted in a case where a defect occurs in the mounted states of components in the middle of a mounting step.

Further, in the component mounting system of the present disclosure, the storage device may store importance of the components stored as check necessary components, and the mounting order setting device may set the mounting order of the check necessary components in the mounting order so that a component with low importance may be mounted first. In this way, it is possible to prevent high importance items from being wasted among the check necessary components, thereby more properly preventing waste of components. The importance of a component can be, for example, a component price or a component stock quantity, or the like, and an item with a low component price or a large stock quantity corresponds to an item with low importance.

BRIEF DESCRIPTION OF DRAWINGS

FIG. 4 is an explanatory diagram illustrating an example of a component type setting screen.

FIG. 5 is an explanatory diagram illustrating an example of an importance setting screen.

FIG. 12 is an explanatory diagram illustrating an example of a setting screen for inspection necessity after mounting.

DESCRIPTION OF EMBODIMENTS

Figure 1:
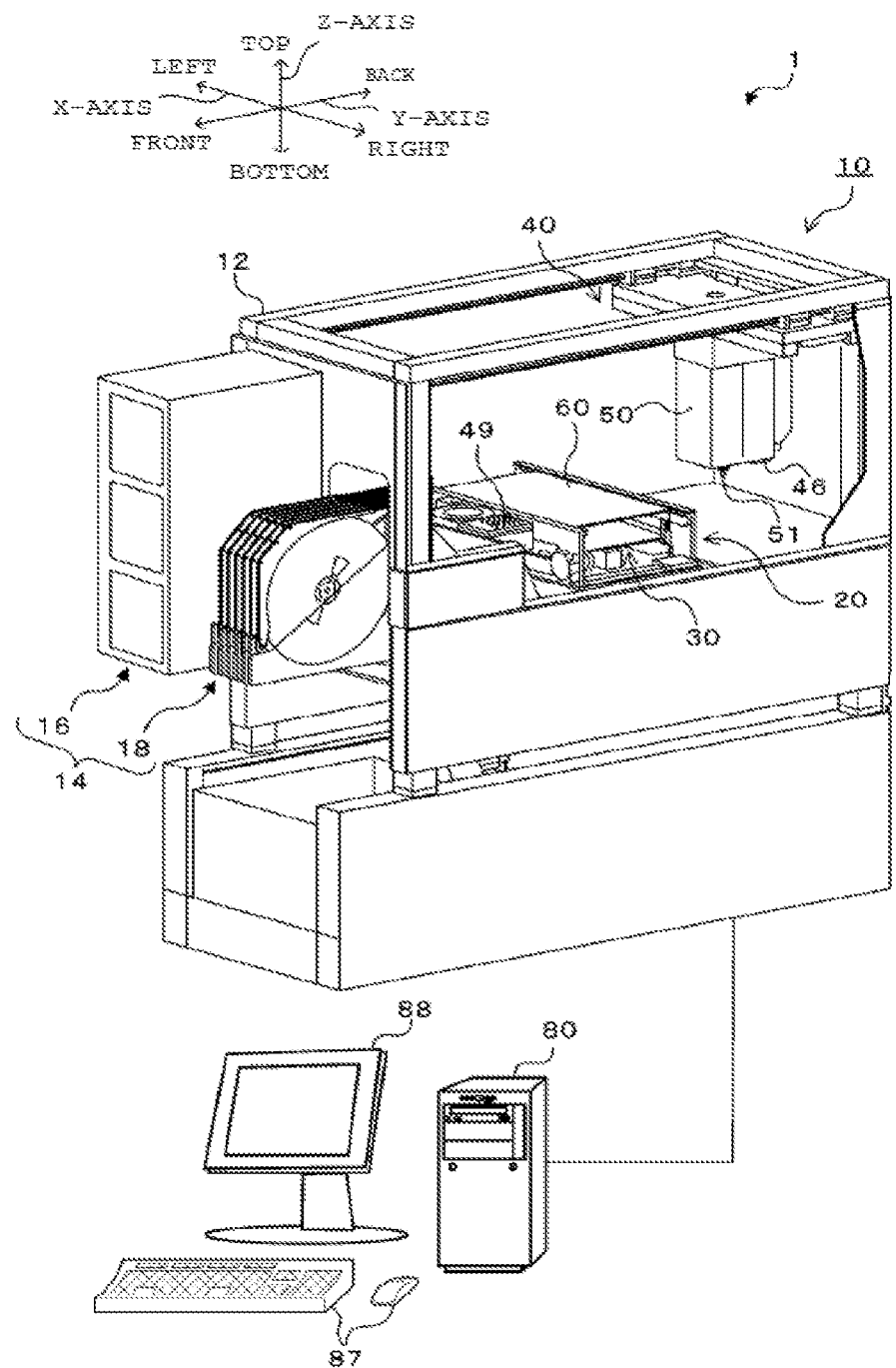
FIG. 1 is a configuration diagram illustrating an outline of a configuration of a component mounting apparatus 10 of a component mounting system 1.

Next, an embodiment of the present disclosure will be described. FIG. 1 is a configuration diagram illustrating an outline of the configuration of a component mounting apparatus 10 of a component mounting system 1, and FIG. 2 is an explanatory diagram illustrating an electrical connection relationship between a control device 70 and a management device 80 of the component mounting apparatus 10.

As illustrated in FIG. 1, the component mounting system 1 includes the component mounting apparatus 10 that mounts components on aboard and the management device 80 that manages the whole component mounting system. The component mounting apparatus 10 is configured to execute a process of mounting relatively small chip components on the board and a process of mounting relatively large components or die components on the board. Although not illustrated, the component mounting system 1 may have multiple the component mounting apparatuses 10.

Figure 2:
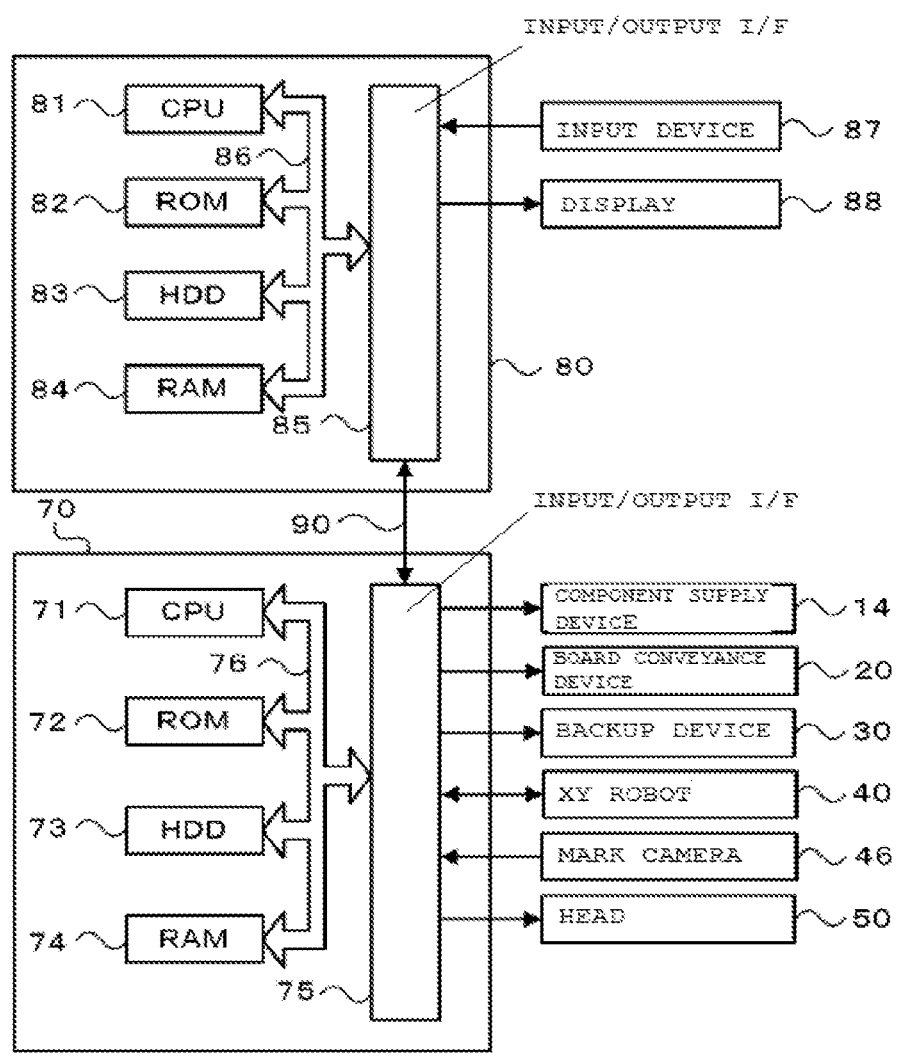
FIG. 2 is an explanatory diagram illustrating an electrical connection relationship between a control device 70 and a management device 80 of the component mounting apparatus 10.

As illustrated in FIG. 1, the component mounting apparatus includes a component supply device 14 that supplies components, aboard conveyance device 20 that conveys the board 60 from left to right in the X-axis direction of FIG. 1, a backup device 30 that backs up the board 60 conveyed by the board conveyance device 20 from the back side, a head 50 to which a plurality (for example, four) of suction nozzles 51 are installed and for picking up the components at the suction nozzle 51 to mount the components on the board 60, an XY robot 40 that moves the head 50 in the XY-directions, a mark camera 46 that is capable of imaging various marks affixed to the surface of the board 60, a nozzle station 49 that is stocked with various nozzles such as the suction nozzles 51 with a small diameter and the suction nozzles 51 with a large diameter, and a control device 70 that controls the whole component mounting apparatus 10 (refer to FIG. 2). The component supply device 14 includes a tray feeder 16 that supplies components by a tray containing relatively large plate-like components (including die components), and a tape feeder 18 that supplies components by a tape containing multiple relatively small components arranged in a row in the left-right direction (X-axis direction).

Figure 3:
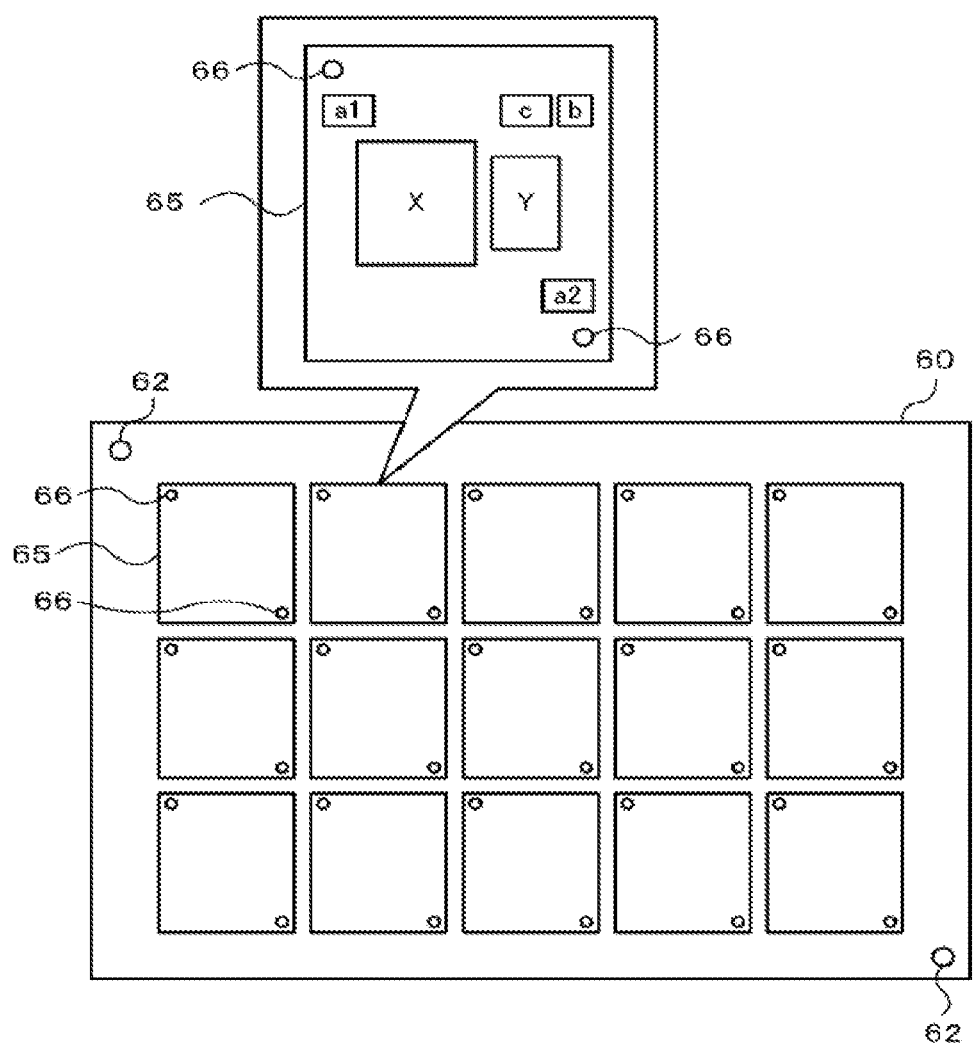
FIG. 3 is a configuration diagram illustrating an outline of a configuration of a board 60.

FIG. 3 is a configuration diagram illustrating an outline of the configuration of the board 60. In the present embodiment, the board 60 is an aggregate board having multiple child boards 65 (work region) delimited by dividing grooves. The component mounting system 1 mounts a component on each child board 65 by the component mounting apparatus 10, and then divides the board 60 along the dividing grooves to produce the multiple child boards 65 on which components are mounted. The board 60 is not limited to a board having multiple child boards 65, and may be produced as one board.

In the board 60, board position fiducial marks 62 are attached at two diagonal corners (the upper left corner and the lower right corner of FIG. 3). In the multiple child boards 65, child board position fiducial marks 66 are attached at two diagonal corners (the upper left corner and the lower right corner of FIG. 3), respectively. These board position fiducial marks 62 or child board position fiducial marks 66 are imaged by the mark camera 46 when the board 60 is positioned by the backup device 30, and are used to obtain positional information of the board 60 or the child board 65. Further, in the present embodiment, it is assumed that chip components a to c and die components X and Y are mounted on each child board 65. In addition, the multiple chip components a (two of a1 and a2) are mounted, and the other components are mounted one by one.

As illustrated in FIG. 2, the control device 70 is configured as a microprocessor with the CPU 71 as the center, and includes a ROM 72, an HDD 73, a RAM 74, and an input and output interface 75 in addition to the CPU 71, which are electrically connected via a bus 76. A position signal of the head 50 from the XY robot 40, an image signal from the mark camera 46, and the like are input to the control device 70 via the input and output interface 75. On the other hand, from the control device 70, a control signal to the component supply device 14, a control signal to the board conveyance device 20, a control signal to the backup device 30, a drive signal to the XY robot 40, a drive signal to the head 50, and the like are output via the input and output interface 75. Further, the control device 70 is connected to the management device 80 via a communication network 90 so as to enable bidirectional communication, and exchanges data and control signals with each other.

The management device 80 is, for example, a general-purpose computer, and includes the CPU 81, a ROM 82, an HDD 83, a RAM 84, an input and output interface 85, and the like, which are electrically connected via a bus 86 as illustrated in FIG. 2. An input signal from an input device 87 such as a mouse or a keyboard is input to the management device 80 via the input and output interface 85, and from the management device 80, an image signal to a display 88 is output via the input and output interface 85. The HDD 83 stores various kinds of information on the mounting process of the component on the board 60. The various kinds of information include nozzle information on the type of the suction nozzle 51 used for the mounting process, component information on each component such as positional information on a mounting position, mounting order of the components to be mounted, and the like. Here, components mounted in the present embodiment include a check unnecessary component (a component that does not require checking in advance) that can be mounted without checking whether or not the mounted states of the other previously mounted components are normal and a check necessary component (a component that requires checking in advance) that can be mounted after checking that the mounted states of the other previously mounted components are normal.

In the management device 80 of the present embodiment, an operator can set a type of components whether each component to be mounted is a check unnecessary component or a check necessary component. This setting is performed using the setting screen displayed on the display 88. FIG. 4 is an explanatory diagram illustrating an example of the component type setting screen. As illustrated in the diagram, on the component type setting screen, for each component of the chip components a to c and the die components X and Y which are components to be mounted, "YES" indicating that checking is required or "NO" indicating that checking is not required can be set. The operator selects a component to be set by moving a selection cursor 88a on the component type setting screen in the up-down direction by operating the input device 87 in the up-down direction, and selects "YES" or "NO" for the component to be set by operating the input device 87 in the left-right direction. Further, the operator can determine the setting on the component type setting screen by moving the selection cursor 88a onto the "determine" button and performing a determination operation of the input device 87. In FIG. 4, the chip components a to c are set to check unnecessary components, and the die components X and Y are set to check necessary components. The chip components may be set to check necessary components and the die components may be set to check unnecessary components.

Further, the management device 80 can set importance for the components which have been set to check necessary components on the component type setting screen. FIG. 5 is an explanatory diagram illustrating an example of the importance setting screen. As illustrated in the diagram, in the importance setting screen, for each component of the die components X and Y which are set to check necessary components, one of the two importance levels, "high" or "low" can be set. Since the operation method (setting method) of the importance setting screen is the same as the component type setting screen, the explanation thereof will be omitted. Here, the operator can set the components which are relatively important, for example, the component whose price is high, to check necessary components, and set the importance of the components which are particularly expensive among the components, to "high" and set the importance of the components with low price to "low". In FIG. 5, the importance of the die component X is set to "high" and the importance of the die component Y is set to "low".

Figure 6:
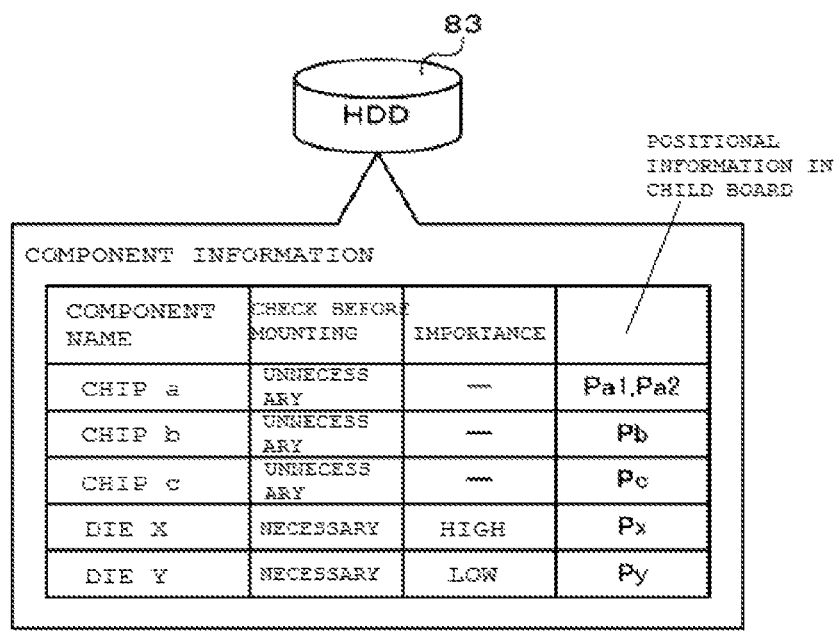
FIG. 6 is an explanatory diagram illustrating an example of component information stored in an HDD 83 of the management device 80.

The management device 80 stores the component information including the contents that have been set in the component type setting screen or the importance setting screen in the HDD 83. FIG. 6 is an explanatory diagram illustrating an example of the component information stored in the HDD 83 of the management device 80. The HDD 83 stores positional information on the mounting position of the components in the child board 65 in addition to the necessity for check of each component and the importance of the check necessary components.

Figure 7:
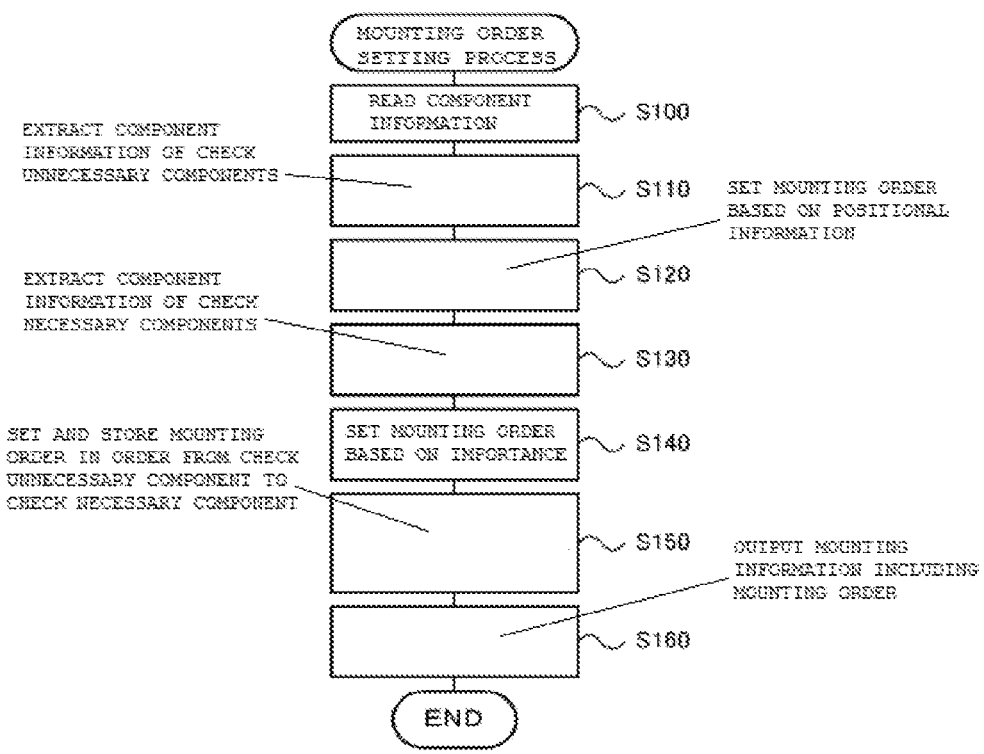
FIG. 7 is a flowchart illustrating an example of a mounting order setting process executed by a CPU 81 of the management device 80.

Next, the operation of the component mounting system 1 in such a configuration will be described. First, the process of setting the mounting order of components in the management device 80 will be described. FIG. 7 is a flowchart illustrating an example of the mounting order setting process executed by the CPU 81 of the management device 80. When the mounting order setting process is executed, the CPU 81 of the management device 80 first reads the component information stored in the HDD 83 (S100), and extracts the component information of the check unnecessary components (chip components a to c) (S110). Next, the CPU 81 sets the mounting order of the check unnecessary components based on the positional information among the extracted component information of the check unnecessary components (S120). The CPU 81 sets the mounting order so that the movement distance of the head 50 becomes shorter based on the positional information of each component. In the present embodiment, the CPU 81 sets the mounting order of the check unnecessary components in order: the chip component a (a1) at the upper left corner, the chip component c, the chip component b, the chip component a (a2) at the lower right corner.

Next, the CPU 81 extracts the component information of the check necessary components (die components X and Y) (S130), and sets the mounting order of the check necessary components in order from a component with low importance to a component with high importance based on the importance among the extracted component information of the check necessary components (S140). In the present embodiment, since the importance of the die component X is "high" and the importance of the die component Y is "low", the CPU 81 sets the mounting order of the check necessary components in order from the die component Y to the die component X. In a case where there are multiple components with the same importance, the CPU 81 sets the mounting order so that the movement distance of the head 50 becomes shorter among the multiple components with the same importance.

Figure 8:
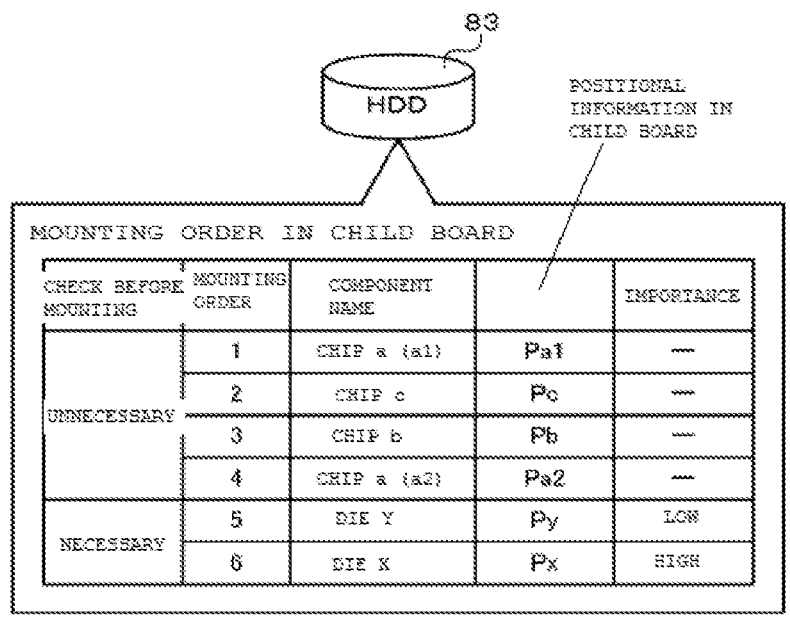
FIG. 8 is an explanatory diagram illustrating an example of mounting order stored in the HDD 83 of the management device 80.

When the mounting order of check unnecessary components and the mounting order of check necessary components are set, the CPU 81 mounts the check unnecessary components first, sets the mounting order so that the check necessary components are mounted later, and stores the mounting order in the HDD 83 (S150). FIG. 8 is an explanatory diagram illustrating an example of the mounting order in the child board 65. As illustrated in the diagram, the mounting order is set in order from a check unnecessary component to a check necessary component, and among the check unnecessary components, the mounting order is set in order from the highest to the lowest in the movement efficiency of the head 50, and is set in order from low importance to high importance among the check necessary components. The CPU 81 outputs the mounting information including the set mounting order to the component mounting apparatus 10 via the communication network 90 (S160), and ends the mounting order setting process. In addition to the mounting order, the mounting information includes nozzle information, component information (positional information of a component), and the like. Since the board 60 includes multiple child boards 65, the component mounting apparatus 10 of the present embodiment respectively mounts check unnecessary components on each of the child boards 65, and then mounts check necessary components.

Figure 9:
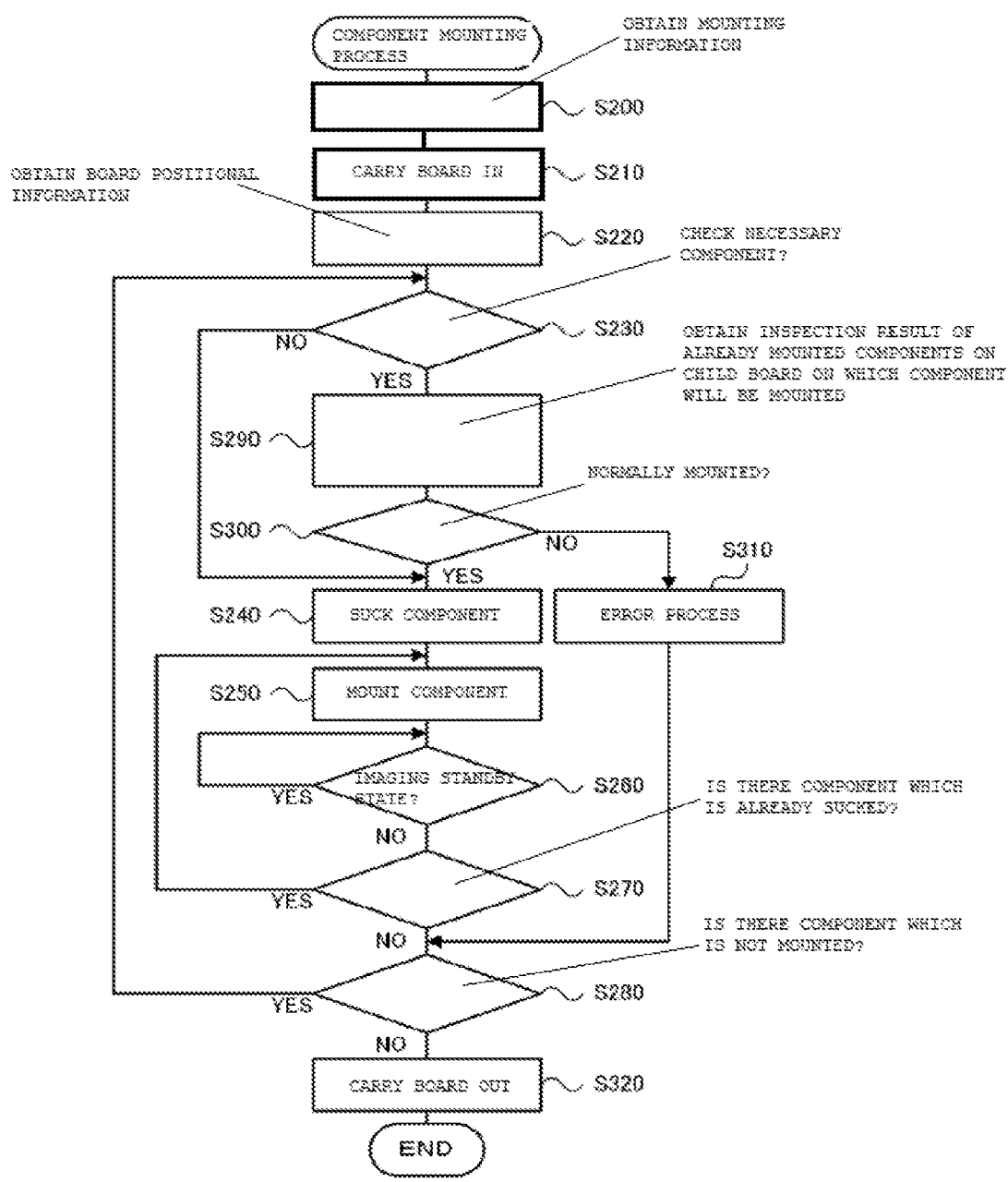
FIG. 9 is a flowchart illustrating an example of a component mounting process executed by a CPU 71 of the control device 70.

Next, a process of mounting components in the component mounting apparatus 10 based on the set mounting order will be described. FIG. 9 is a flowchart illustrating an example of the component mounting process executed by the CPU 71 of the control device 70. When the component mounting process is executed, the CPU 71 of the control device 70 first obtains the mounting information output from the management device 80 via the communication network 90 (S200), and carries the board 60 in (S210). In S210, the CPU 71 controls the board conveyance device 20 to convey the board 60 to a predetermined position on the backup device 30, and controls the backup device 30 to fix the board 60 at a predetermined position. Next, the CPU 71 obtains the positional information of the board 60 (S220). In S220, the CPU 71 controls the XY robot 40 and the mark camera 46 to image the board position fiducial mark 62 attached to the board 60 or the child board position fiducial mark 66 attached to the child board 65, and processes the obtained image to obtain positional information. Subsequently, the CPU 71 determines whether or not a current component to be mounted that will be sucked to the suction nozzle 51 is a check necessary component (S230). As described above, the mounting order of the components is set so that the check unnecessary components are mounted first. Therefore, the CPU 71 determines that a component is not a check necessary component in S230 until the mounting of the check unnecessary components is completed, and sucks the component to the suction nozzle 51 without checking the mounted states of the other components (S240). In S240, the CPU 71 controls the component supply device 14 to supply a component at a supply position and controls the XY robot 40 and the head 50 to suck the component supplied at the supply position to the suction nozzle 51. In a case where it is necessary to replace the suction nozzle 51 installed to the head 50, the CPU 71 exchanges with the suction nozzle 51 of a necessary nozzle type from the nozzle station 49 before sucking the component. For example, in a case where a component to be mounted is switched from a chip component to a large component or a die component, the suction nozzle 51 is replaced from the suction nozzle 51 with a small diameter to the suction nozzle 51 with a large diameter or the suction nozzle 51 for a die component.

Figure 10:
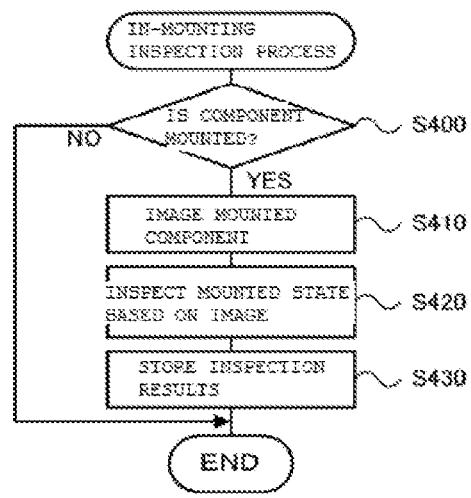
FIG. 10 is a flowchart illustrating an example of an in-mounting inspection process executed by the CPU 71 of the control device 70.

When a component is sucked to the suction nozzle 51, the CPU 71 mounts the component on the board 60 (S250) and determines whether or not the component is in an imaging standby state of the mounted component (S260). In S250, the CPU 71 controls the XY robot 40 and the head 50 to mount the component at a position based on the positional information. Here, in the present embodiment, the CPU 71 executes the in-mounting inspection process of inspecting the mounted state of the mounted component during the execution of the component mounting process, in parallel. Therefore, in the in-mounting inspection process, the CPU 71 determines that the component is in the imaging standby state in S260 until imaging necessary for inspection is performed. Hereinafter, the in-mounting inspection process will be described. FIG. 10 is a flowchart illustrating an example of the in-mounting inspection process.

In the in-mounting inspection process, the CPU 71 first determines whether or not a component is mounted on the board 60 (S400), and if it is determined that the component is not mounted on the board 60, the in-mounting inspection process is ended as it is. On the other hand, if it is determined that the component is mounted on the board 60, the mounted component is imaged (S410). In S410, the CPU 71 controls the mark camera 46 to image the component mounted on the board 60. In this way, imaging of the component in the in-mounting inspection process is performed while the head 50 is stopped immediately after the component is mounted, by using the mark camera 46 for obtaining the positional information of the board 60. When the component is imaged in S410, the CPU 71 determines that the component is not in the imaging standby state in S260 described above. When the image of the component is captured in this way, the CPU 71 inspects the mounted state of the component based on the captured image (S420), stores the inspection result in the RAM 74 (S430), and ends the in-mounting inspection process. In S420, the CPU processes the obtained image, detects the amount of positional deviation of the component, inspects whether or not the deviation is within an allowed range, and determines whether or not the mounted state of the component is normal. Further, whether or not the inspection result stored in the RAM 74 is normal is stored in association with the identification information of the child board 65 and the identification information of the component. As described above, in the present embodiment, the mounted state of the component is inspected using the image captured by the mark camera 46. In a case where the mounted component is the last component in the child board 65, that is, in a case where the mounted component is the last die component X in the mounting order in the child board 65, the CPU 71 may skip inspection of the mounted state of the component without capturing the image of the component. This is because a check necessary component is not subsequently mounted in the same child board 65, and therefore there is no need for inspection.

Returning to the description of the component mounting processing in FIG. 9, if the CPU 71 determines that a component is not in the imaging standby state in S260, the CPU 71 determines whether or not there is a component which is sucked to the suction nozzle 51 (S270). If there is a component which is already sucked to the suction nozzle 51, the CPU 71 returns to S250 to perform the process. Further, if the CPU 71 determines that there is no component which is already sucked to the suction nozzle 51 in S270, the CPU 71 determines whether or not there is a component which is not mounted on the board 60 (S280) if the CPU 71 determines that there is a component which is not mounted, the CPU 71 returns to S230 to perform the process. If mounting of the check unnecessary components (chip components a to c) is completed on each of the child boards 65 while the mounting process is repeated, the CPU 71 determines that a component to be mounted is a check necessary component (die component Y) in S230, obtains the inspection result of the mounted components in the child board 65 on which a component will be mounted from the RAM 74 (S290), and determines whether or not the mounted states of all the components are normal based on the inspection results (S300). In a case where there is a component whose inspection result cannot be obtained, the CPU 71 waits until the determination result of the component is obtained. If the CPU 71 determines that the mounted states of all the components in the child board 65 on which a component will be mounted are normal, the CPU 71 sucks a check necessary component to the suction nozzle 51 and mounts the component on the board 60 in S240 and S250. For example, if a suction defect of the component occurs, there is a case where a recovery processing of mounting a component which is sucked again is executed after the component is discarded. In the present embodiment, since the determination is made based on the inspection result before a check necessary component is sucked to the suction nozzle 51, it is possible to suck the check necessary component to the suction nozzle 51 and mount the component after checking that mounting of a component which is a recovery process target is completed (inspection result of a component to be recovered).

In this way, check unnecessary components such as the chip components a to c are mounted first on the child board 65, and based on the inspection results of the components, after checking that the mounted state of each component is normal, a check necessary component such as the die component Y is sucked to the suction nozzle 51 and mounted in the child board 65. Since there is a component whose mounted state is not normal, a check necessary component such as the die component Y is not newly mounted on the child board 65 which is likely to be discarded in a later step of the inspection process. Therefore, it is possible to prevent check necessary components from being wastefully consumed. Further, when the die component Y with low importance is mounted, the mounted state of the die component Y is also inspected in the in-mounting inspection process. Then, when the die component Y is mounted on each child board 65, the die component X with high importance will be mounted. Therefore, when the die component X is mounted, based on the inspection result of the die component Y, it is possible to mount the die component X after it is checked that the die component Y in the child board 65 on which the die component X will be mounted is normally mounted in S290 and S300. Therefore, in a case where the mounted state of the die component Y with low importance is not normal, the die component X with high importance will not be mounted, and therefore there is no waste of the die component X with high importance. When the die component Y is mounted, it is already checked that the mounted states of the check unnecessary components (chip component a to c) are normal. Therefore, when the die component X is mounted in S290 and S300, it is enough to determine whether or not the mounted state is normal for only the other component (die component Y only) whose mounted state has not been checked.

If the CPU 71 determines that the mounted state of any one of the mounted components in the child board 65 on which a component will be mounted is not normal, the CPU 71 performs an error process (S310), and then performs the process of S280. As the error process, the CPU 71 performs, for example, a process of setting the child board 65 on which the current component will be mounted to a skip board on which a component will not be mounted.

If the CPU 71 determines that there is no component which is not mounted in S280, the CPU 71 carries the board 60 out (S320) and ends the component mounting processing. In S320, the CPU 71 controls the backup device 30 to unlock the board 60, and then controls the board conveyance device 20 to carry the board 60 out of the apparatus. The component mounting system 1 may include a dedicated device for inspecting the mounted state of each component in a later step after the mounting process in the component mounting apparatus 10. In the component mounting apparatus 10 of the present embodiment, the components in the child board 65 are inspected, but the dedicated device for inspection may inspect the mounted states of all the components. Alternatively, if there is a component which is not inspected in the component mounting apparatus 10 (for example, the last component in the child board 65), the dedicated device for inspection may inspect only that component, and inspection of the component which is already inspected in the component mounting apparatus 10 may be skipped.

Here, the correspondence relationship between the constituent elements of the present embodiment and the constituent elements of the present disclosure will be clarified. The CPU 71, the XY robot 40, and the head 50 of the control device 70 of the component mounting apparatus 10 that executes the component mounting process of the present embodiment in FIG. 9 correspond to mounting device of the present disclosure, and the CPU 71 of the control device 70 that executes the process of S420 in the in-mounting inspection process in FIG. 10 corresponds to inspection device. Further, the mark camera 46 and the CPU 71 of the control device 70 that executes the process of S400 and S410 in the in-mounting inspection process correspond to the imaging device. Further, the display 88 displaying the component type setting screen of FIG. 4, the input device 87, and the CPU 81 of the management device 80 correspond to the setting accepting device, the HDD 83 of the management device 80 corresponds to the storage device, the CPU 81 of the management device 80 that executes the processes of S100 to S150 in the mounting order setting processing of FIG. 7 corresponds to the mounting order setting device, and the CPU 81 of the management device 80 that executes the process of S160 in the mounting order setting process and the communication network 90 correspond to the output device.

When the above-described component mounting apparatus 10 of the present embodiment mounts check unnecessary components (chip components a to c) that do not require checking of the mounted states of the other components before being mounted and check necessary components (die components X and Y) that require checking of the mounted states of the other components before being mounted on the board 60, the component mounting apparatus 10 first inspects the mounted state of each component by mounting the check unnecessary components on the board 60, checks that the mounted states of the check unnecessary components are normal based on the inspection results, and mounts the check necessary components on the board 60. In a case where the mounted states of the check unnecessary components are not normal, it is possible to prevent the check necessary components from being wastefully consumed without mounting the check necessary components on the board 60.

Further, when a component is mounted on the board 60, the component mounting apparatus 10 images the component with the mark camera 46 and inspects the mounted state of the component based on the obtained image while mounting the next component on the board 60 when the component is imaged. Therefore, it is possible to perform the inspection process and the mounting process in parallel.

Further, since the component mounting apparatus 10 checks that the mounted state of a check necessary component (die component Y) whose mounting order is earlier is normal based on the inspection result, and then mounts a check necessary component (die component X) whose mounting order is later on the board 60, in a case where multiple check necessary components are mounted, it is possible to prevent components to be mounted later from being wasted. Further, since the management device 80 stores the importance of the components which are set as check necessary components and sets the mounting order so that a component with low importance is mounted first, it is possible to prevent a component with high importance from being wasted.

The present disclosure is not limited to the above-described embodiment and may be implemented in various aspects without departing from the technical scope of the present disclosure.

For example, in the above-described embodiment, imaging of a mounted component is performed while the head 50 is stopped, but the present disclosure is not limited thereto, the imaging may be performed while the head 50 is moving. For example, if a mounted component and identification information (such as child board fiducial mark 66) are included in the same visual field range of the mark camera 46, even when the component is imaged by the mark camera 46 while the head 50 is moving, the mounting position and the amount of positional deviation of the component can be grasped based on the position of the identification information (child board fiducial mark 66) in the captured image to inspect the mounted state of the component. As a result, it is possible to shorten the time of an imaging standby state, thereby suppressing a reduction in mounting efficiency.

In the above-described embodiment, imaging a mounted component is assumed to be performed immediately after mounting the component, but the present disclosure is not limited thereto, and the component may be imaged while the next component is being mounted. For example, like the chip component b and the chip component c, in a case where two components are mounted in adjacent positions, and a previously mounted component (chip component c) is included in the same visual field range of the mark camera 46 when the subsequent component (chip component b) is mounted, the previously mounted component may be imaged while the subsequent component is being mounted. As a result, it is possible to shorten the time of an imaging standby state, thereby suppressing a reduction in mounting efficiency.

Figure 11:
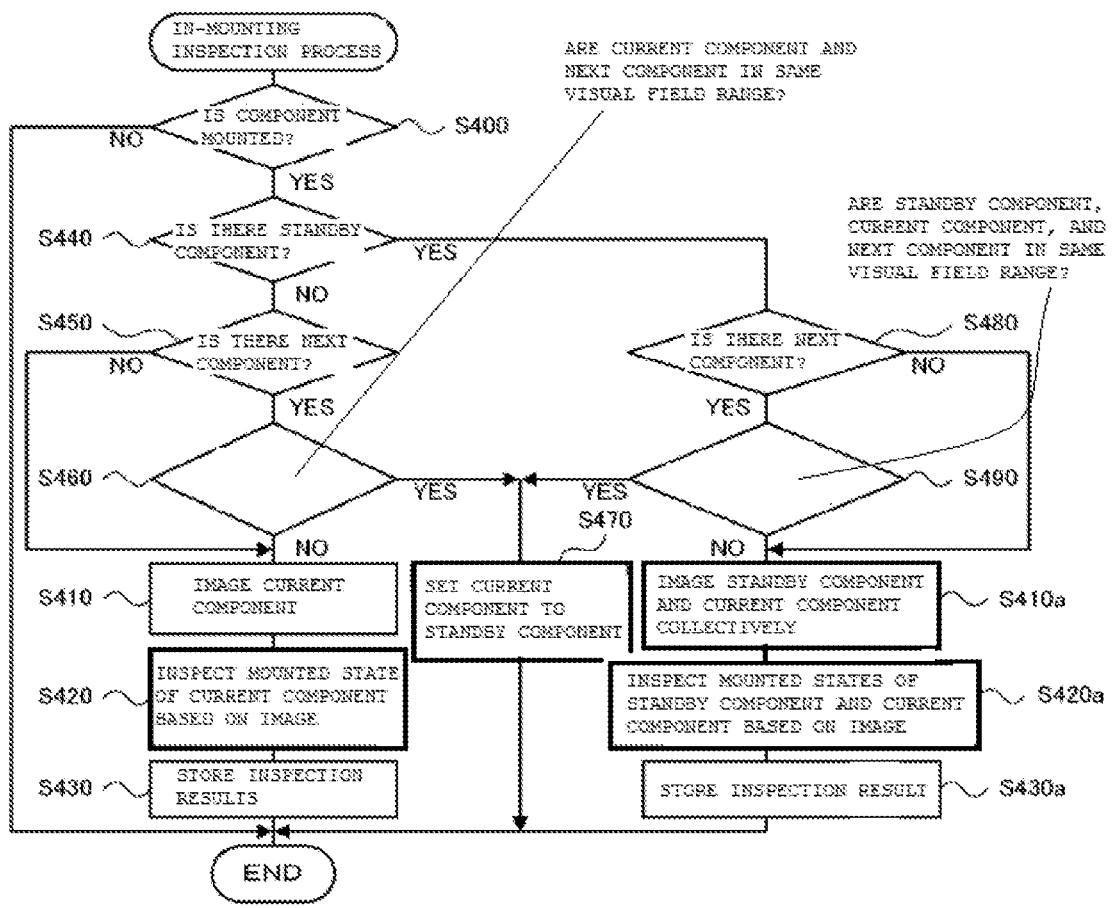
FIG. 11 is a flowchart illustrating an in-mounting inspection process of an alternative embodiment.

In the above-described embodiment, a component is imaged every time the component is mounted, but the present disclosure is not limited thereto, and multiple components may be imaged collectively. FIG. 11 is a flowchart illustrating a process of the in-mounting inspection process of an alternative embodiment. In the flowchart of the alternative embodiment, the same step numbers are given to the same processes as those in the embodiment, and a detailed description thereof will be omitted. In the in-mounting inspection process of the alternative embodiment, if the CPU 71 determines that a component is mounted in S400, the CPU 71 respectively determines whether or not there are standby components waiting to be imaged collectively (S440) and whether or not there is a component (the next component) to be mounted next (S450 and S480). If the CPU 71 determines that there is no standby component and there is the next component, the CPU 71 determines whether or not the component which is mounted this time (current component) and the next component are included in the same visual filed range of the mark camera 46 based on the positional information of the current component and the positional information of the next component (S460). If the CPU 71 determines that the current component and the next component are not included in the same visual field range of the mark camera 46 or there is no standby component in S440 and S450 and there is no next component, the CPU 71 images the current component with the mark camera 46, inspects the mounted state of the component, stores the inspection result in the RAM 74 (S410 to S430), and ends the in-mounting inspection process. On the other hand, if the CPU 71 determines that the current component and the next component are included in the same visual field range of the mark camera 46 in S460, the CPU 71 sets the current component to a standby component (S470), and ends the in-mounting inspection process. If the current component is set to a standby component, it is determined that the component is not in the imaging standby state in S260 of the component mounting process in FIG. 10. Here, for example, in a case where the CPU 71 first mounts the chip component a1 at the upper left corner in the child board 65, the CPU 71 determines that there is no standby component, and if the CPU 71 determines that the chip component a1 at the upper left corner and the chip component c are not included in the same visual field range of the mark camera 46, the CPU executes imaging and inspection of the chip component a1. On the other hand, in a case where the CPU 71 mounts the chip component c in the child board 65, the CPU 71 determines that there is no standby component, and if the CPU 71 determines that the chip component c and the chip component b are included in the same visual field range of the mark camera 46, the CPU 71 sets the chip component c to a standby component.

If the CPU 71 executes the in-mounting inspection process after setting a standby component in S470, it is determined that there is a standby component in S440 and there is the next component in S480, the CPU 71 determines whether or not the standby component, the current component, and the next component are included in the same visual field range of the mark camera 46 (S490). If the CPU 71 determines that the standby component, the current component, and the next component are included in the same visual field range of the mark camera 46, the CPU newly sets the current component to a standby component (S470), and ends the in-mounting inspection process. On the other hand, when the CPU 71 determines that the standby component, the current component, and the next component are not included in the same visual field range of the mark camera 46 in S490 or there is no next component in S480, the CPU 71 images the standby component and the current component collectively with the mark camera 46 (S410*a*), respectively inspects the mounted state of the standby component and the current component based on the obtained image (S420a), stores the inspection results in the RAM 74 (S430a), and ends the in-mounting inspection process. For example, in a case where the CPU 71 mounts the chip component b in a state where the chip component c is set to a standby component, if the CPU 71 determines that the chip component c which is a standby component, the chip component b which is the current component, and the chip component a2 at the lower right corner which is the next component are not included in the same visual field range of the mark camera 46, the CPU 71 images and inspects the chip component c which is the standby component and the chip component b which is the current component collectively. In this way, by collectively imaging and inspecting the components included in the same visual field range of the mark camera 46, it is possible to shorten the time of the imaging standby state. Therefore, it is possible to suppress a reduction in mounting efficiency by inspection during the mounting.

In the above-described embodiment, the mounted states of all the check unnecessary components are inspected, but the present disclosure is not limited thereto, inspection of some of the check unnecessary components may be skipped. In a case where inspection is skipped, the management device 80 may accept setting as to whether or not to inspection is performed. FIG. 12 is an explanatory diagram illustrating an example of the setting screen for inspection necessity after mounting. As illustrated in FIG. 12A, it is possible to set whether or not inspection is performed for each component type. For example, the chip components a and c may be inspected and inspection of the chip b may be skipped. Alternatively, as illustrated in FIG. 12B, it is possible to set whether or not inspection is performed based on the mounting order. The first chip component and second chip component (chip component a1 and chip component c) in the mounting order may be inspected and inspection of the third chip component and the fourth chip component (chip component b and chip component a2) in the mounting order may be skipped. It is also possible to set whether or not inspection is performed by combining the component type and the mounting order. For example, inspection of the chip component a2, which is the second chip component among the components a to be mounted on the child board 65, may be skipped. The management device 80 stores the setting as to whether or not inspection is performed by accepting via the setting screen for determining inspection necessity, in the HDD 83, and transmits the mounting information including the setting to the component mounting apparatus 10. In the in-mounting inspection process of FIG. 10, in a case where inspection of some of the components skipped, if the CPU 71 determines that a component is mounted in S400, and the component is excluded from inspection, the CPU 71 may end the in-mounting inspection process as it is, and determine that the component is not in the imaging standby state in S260 of FIG. 9. Further, in the in-mounting inspection process of the alternative embodiment in FIG. 11, the CPU 71 may use the next component that is not excluded from inspection (to be inspected) as the next component. Then, in S300 of the component mounting processing in FIG. 9, if the mounted states of the inspected components are normal, the CPU 71 determines that the mounted states of all the components in the child board 65 on which a component will be mounted, including the components whose inspection is skipped, are normal. In this way, it is possible to shorten the inspection time compared with the case where all the check unnecessary components (chip components a to c) are inspected. Further, in a case where it is not necessary to inspect the mounted states of all the components, such as the case of mounting multiple components of the same type or mounting components which are not likely to cause mounting defects, it is possible to prevent check necessary components from being wasted while suppressing excessive inspection.

In the above-described embodiment, two levels of "high" and "low" are set as the importance, but the present disclosure is not limited thereto, and multiple three or more levels may be set. Alternatively, more specific numerical values may be set as the importance, for example, prices of components may be set. In a case where the prices of components are set, the management device 80 can accept the price of each component and a reference price (threshold value), and the component whose price is less than the reference price is set to a component with low importance, and the component whose price is equal to or greater than the reference price may be set to a component with high importance. Alternatively, the importance may be set based on the stock quantity of each component, and a component whose stock quantity is equal to or greater than a threshold value and having room in stock is set to a component with low importance, and a component whose stock quantity is less than the threshold value and having no room in stock may be set to a component with high importance. These prices, stock quantities, or the like are not limited to the setting of importance, and may be used for setting a check unnecessary component or a check necessary component. That is, the management device 80 may set a component with a low price to a check unnecessary component and a component with a high price to a check necessary component, or a component with a large stock quantity to a check unnecessary component, and a component with a small stock quantity may be set to a check necessary component.

In the above-described embodiment, a camera for imaging a component after being mounted is also used as the mark camera 46 for imaging the various marks affixed to the board, but the present disclosure is not limited thereto, and a camera dedicated for imaging a component after being mounted (imaging means) may be provided.

INDUSTRIAL APPLICABILITY

The present disclosure can be used in the manufacturing industry of component mounting apparatuses, and the like.

REFERENCE SIGNS LIST

1: component mounting system, 10: component mounting apparatus, 12: main body frame, 14: component supply device, 16: tray feeder, 18: tape feeder, 20: board conveyance device, 30: backup device, 40: XY robot, 46: mark camera, 49: nozzle station, 50: head, 51: suction nozzle, 60: board, 62: board position fiducial mark, 65: child board, 66: child board position fiducial mark, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: display, 90: communication network

The invention claimed is:

1. A component mounting apparatus comprising:
mounting device for mounting components on a board; and
inspection device configured to determine a mounted state of the component mounted on the board, wherein the components include a plurality of check unnecessary components that do not require checking of a mounted state of mounted components before being mounted and a plurality of check necessary components that requires checking of a mounted state of the mounted components before being mounted, each of the check unnecessary components are mounted prior to mounting the check necessary components, the mounting device is configured to mount a first check necessary component of the plurality of check necessary components on the board after the inspection device determines that the mounted state of the mounted components are normal, and wherein the mounting device is configured to mount a second check necessary component on the board after checking the mounted states of the mounted components included the first mounted check necessary component are normal based on the inspection result.

2. The component mounting apparatus according to claim 1, further comprising:

imaging device configured to image the mounted components mounted on the board, wherein the inspection device is configured to determine the mounted state of the mounted components based on an image captured by the imaging device, and.

3. The component mounting apparatus according to claim 2, wherein the imaging device is configured to image the check unnecessary components after the check unnecessary components are mounted on the board in a case where the check unnecessary components are included in a same visual field range.

4. The component mounting apparatus according to claim 3, wherein the inspection device is configured to skip inspection of some of the check unnecessary components among the check unnecessary components mounted on the board, and the mounting device is configured to mount the check necessary components on the board if it is checked that the mounted states of remaining check unnecessary components except for the some check unnecessary components are normal.

5. A component mounting system comprising:

the component mounting apparatus according to claim 3; and a management device that manages mounting order of the components in the component mounting apparatus, wherein the management device includes setting accepting device for accepting setting as to whether the component is the check unnecessary component or the check necessary component, storage device for storing an accepted setting in association with each component, mounting order setting device for setting the check unnecessary component first in the mounting order before mounting the check necessary component, and output device for outputting the set mounting order to the component mounting apparatus.

6. The component mounting system according to claim 5, wherein the storage device is configured to store importance of the components stored as the check necessary components, and the mounting order setting device is configured to set the mounting order of the check necessary components in the mounting order so that a component with low importance is mounted first.

* * * * *